(12) United States Patent
Tsai

(10) Patent No.: US 9,772,142 B2
(45) Date of Patent: Sep. 26, 2017

(54) WATER-COOLING DEVICE WITH STATOR AND ROTOR PUMPING UNIT

(71) Applicant: Bor-Bin Tsai, Taipei (TW)

(72) Inventor: Bor-Bin Tsai, Taipei (TW)

(73) Assignee: Asia Vital Components Co., Ltd., Taipei (TW)

( * ) Notice: Subject to any disclaimer, the term of this patent is extended or adjusted under 35 U.S.C. 154(b) by 419 days.

(21) Appl. No.: 13/759,053

(22) Filed: Feb. 5, 2013

(65) Prior Publication Data

US 2014/0216694 A1 Aug. 7, 2014

(51) Int. Cl.
| F28D 15/00 | (2006.01) |
| F28F 3/12 | (2006.01) |
| H01L 23/473 | (2006.01) |
| F04D 13/06 | (2006.01) |
| F04D 29/58 | (2006.01) |

(52) U.S. Cl.
CPC ......... *F28D 15/00* (2013.01); *F04D 13/0606* (2013.01); *F04D 13/0673* (2013.01); *F04D 29/5806* (2013.01); *F28F 3/12* (2013.01); *H01L 23/473* (2013.01); *F28F 2250/08* (2013.01); *H01L 2924/0002* (2013.01)

(58) Field of Classification Search
CPC .. H02K 9/19; H02K 9/22; H02K 3/24; H02K 5/20; F04D 29/445; F04D 29/5806; F04D 13/0606; F04D 13/0626; F04D 13/0673; F28D 15/00; H01L 23/473; F28F 3/12
See application file for complete search history.

(56) References Cited

U.S. PATENT DOCUMENTS

| 4,311,932 | A | * | 1/1982 | Olson | 310/61 |
| 5,051,634 | A | * | 9/1991 | Overton | 310/64 |
| 7,016,195 | B2 | * | 3/2006 | Ito et al. | 361/699 |
| 7,319,587 | B2 | * | 1/2008 | Tomioka | F04D 29/588 165/80.4 |
| 7,729,118 | B2 | * | 6/2010 | Lai et al. | 361/699 |
| 2006/0171801 | A1 | * | 8/2006 | Manabe | F04D 13/0673 415/176 |
| 2007/0243086 | A1 | * | 10/2007 | Sakai | F04D 13/0606 417/423.1 |

(Continued)

FOREIGN PATENT DOCUMENTS

| CN | 101113736 A | 1/2008 |
| CN | 201928112 U | 8/2011 |

(Continued)

*Primary Examiner* — Len Tran
*Assistant Examiner* — Gordon Jones
(74) *Attorney, Agent, or Firm* — C. G. Mersereau; Nikolai & Mersereau, P.A.

(57) ABSTRACT

A water-cooling device includes a main body having a pump chamber and a heat exchange chamber, which are partitioned from each other by a water room partitioning board. The water room partitioning board has a communication section for communicating the pump chamber with the heat exchange chamber. A pump unit is disposed in the pump chamber. A heat transfer unit is disposed in the heat exchange chamber. A cooling fluid is filled up in the pump chamber and the heat exchange chamber. The water-cooling device has greatly enhanced heat dissipation performance. Moreover, the water-cooling device is free from the problem of overheating of the stator assembly in operation.

6 Claims, 10 Drawing Sheets

(56) References Cited

U.S. PATENT DOCUMENTS

| | | | | |
|---|---|---|---|---|
| 2007/0253844 | A1* | 11/2007 | Chen | F04D 13/0673 417/423.3 |
| 2009/0162225 | A1* | 6/2009 | Lai | F04D 13/0673 417/423.3 |
| 2010/0322801 | A1* | 12/2010 | Tang | F04D 13/08 417/423.14 |
| 2012/0308417 | A1* | 12/2012 | Hsu et al. | 417/423.15 |

FOREIGN PATENT DOCUMENTS

| | | | |
|---|---|---|---|
| CN | 102062111 B | 11/2012 | |
| WO | WO 2011099196 A2 * | 8/2011 | F04D 13/0606 |

\* cited by examiner

WATER-COOLING DEVICE WITH STATOR AND ROTOR PUMPING UNIT

BACKGROUND OF THE INVENTION

1. Field of the Invention

The present invention relates generally to a water-cooling device, and more particularly to a water-cooling device, which has higher heat dissipation performance and is free from the problem of overheating of the internal stator assembly.

2. Description of the Related Art

A conventional water-cooling thermal module includes a heat sink made of copper or aluminum with good thermal conductivity. One side of the heat sink is directly attached to a heat generation component such as a central processor for absorbing the heat generated by the central processor. The other side of the heat sink transfers the heat to a cooling fluid in the water-cooling thermal module. The heat exchange efficiency of such structure is not good. This is because the heat exchange or heat dissipation area between the heat sink and the cooling fluid is too small. When the cooling fluid quickly flows through the radiating fins of the heat sink, the cooling fluid can hardly carry away the heat absorbed by the radiating fins. In order to eliminate this shortcoming, multiple column bodies or flow ways are disposed on one side of the heat sink to enlarge the heat exchange or heat dissipation area between the heat sink and the cooling fluid. However, the heat dissipation performance can be only slightly enhanced and the effect is still poor. As a result, the heat can be hardly effectively dissipated and the heat dissipation efficiency is poor.

Moreover, in operation of the pump unit of the conventional water-cooling module, the stator assembly will generate heat. In addition, the stator assembly must be isolated from the cooling fluid. Therefore, the stator assembly itself can be only air-cooled to dissipate the heat. Such cooling effect is poor. Accordingly, it often takes place that the stator assembly burns out due to overheating. The problem of overheating of the stator assembly will shorten the lifetime of the water-cooling module.

Also, in the conventional water-cooling module, in order to protect the stator assembly of the pump unit from damage due to contact with the cooling fluid, the stator assembly is positioned on outer side of the water-cooling module, while the rotor assembly for driving the cooling fluid to circulate within the water-cooling module is positioned inside the water-cooling module corresponding to the stator assembly. The magnetization between the stator assembly and the rotor assembly takes place through the housing of the water-cooling module so as to operate the rotor assembly. In consideration of sufficient structural strength, the housing of the water-cooling module must have a certain thickness. Therefore, the rotor assembly and the stator assembly are spaced from each other by a considerable distance due to the thickness of the housing. This will affect the operation efficiency of the pump unit. As a result, as a whole, the heat dissipation performance of the water-cooling module will be deteriorated.

SUMMARY OF THE INVENTION

It is therefore a primary object of the present invention to provide a water-cooling device, which has higher heat dissipation performance.

It is a further object of the present invention to provide the above water-cooling device, which has longer lifetime.

To achieve the above and other objects, the water-cooling device of the present invention includes a main body. The main body has a pump chamber and a heat exchange chamber, which are partitioned from each other by a water room partitioning board. The water room partitioning board has a communication section for communicating the pump chamber with the heat exchange chamber. A pump unit is disposed in the pump chamber. A heat transfer unit is disposed in the heat exchange chamber. A cooling fluid is filled up in the pump chamber and the heat exchange chamber.

Alternatively, the water-cooling device of the present invention includes a main body and a heat transfer unit.

The main body has a receiving space. The receiving space has a closed side and an open side and a water room partitioning board. The receiving space is partitioned by the water room partitioning board into a pump chamber and a heat exchange chamber. The water room partitioning board has a communication hole in communication with the pump chamber and the heat exchange chamber. A pump unit is disposed in the pump chamber of the main body. A cooling fluid is filled in the receiving space. An inlet is disposed on the closed side in communication with the pump chamber corresponding to the pump unit. An outlet is disposed on one side of the main body, which side is adjacent to the heat exchange chamber. The outlet communicates with the heat exchange chamber.

The heat transfer unit has a heat absorption face and a heat dissipation face. The heat dissipation face correspondingly blocks the open side.

The water-cooling device of the present invention has much better heat dissipation performance. In addition, the rotor assembly and stator assembly of the pump unit are together arranged in the pump chamber. That is, the stator assembly is also immersed in the cooling fluid and cooled by the cooling fluid. Therefore, the problem of overheating of the stator assembly in operation is solved. In this case, the water-cooling device has a longer lifetime.

In addition, the rotor assembly and the stator assembly of the pump unit are arranged in the same chamber so that the distance between the stator assembly and the rotor assembly is shortened. In this case, the magnetic loss caused in magnetization between the rotor assembly and the stator assembly is reduced so that the operation efficiency of the pump unit is increased. Therefore, the water-cooling device has higher heat dissipation efficiency.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
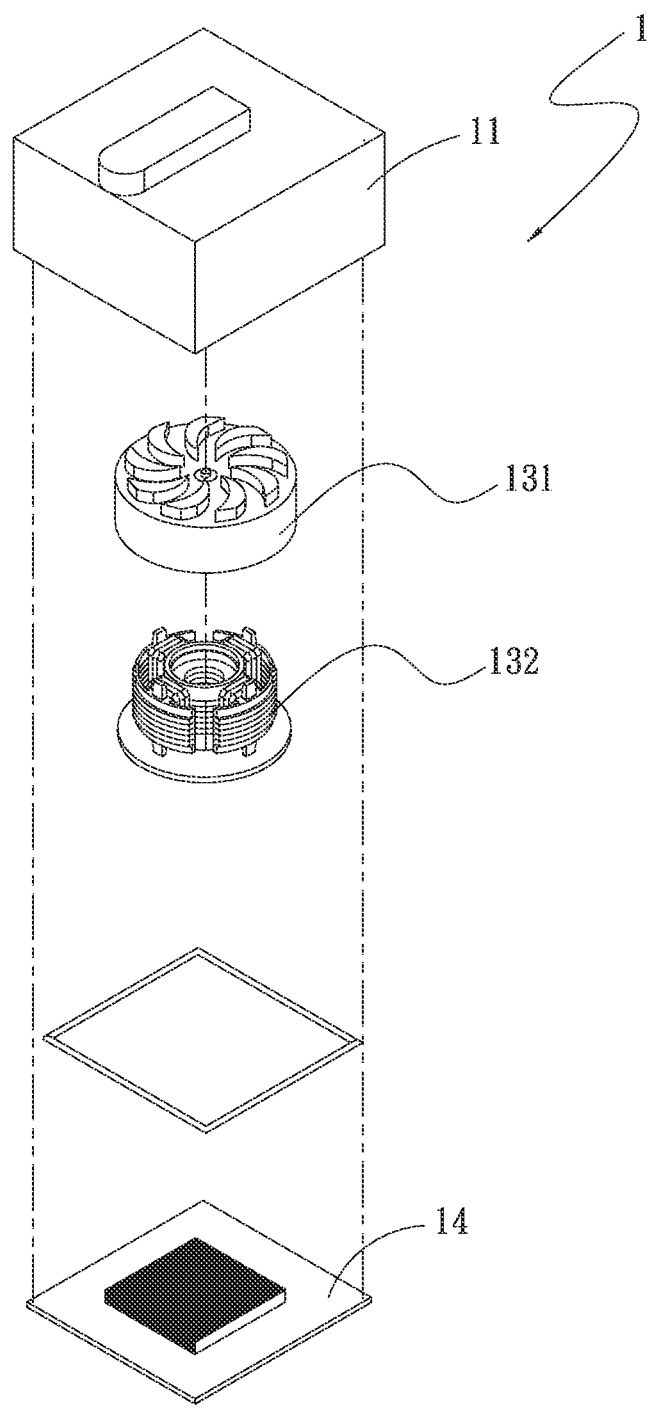
FIG. 1 is a perspective exploded view of a first embodiment of the water-cooling device of the present invention.
Figure 2:
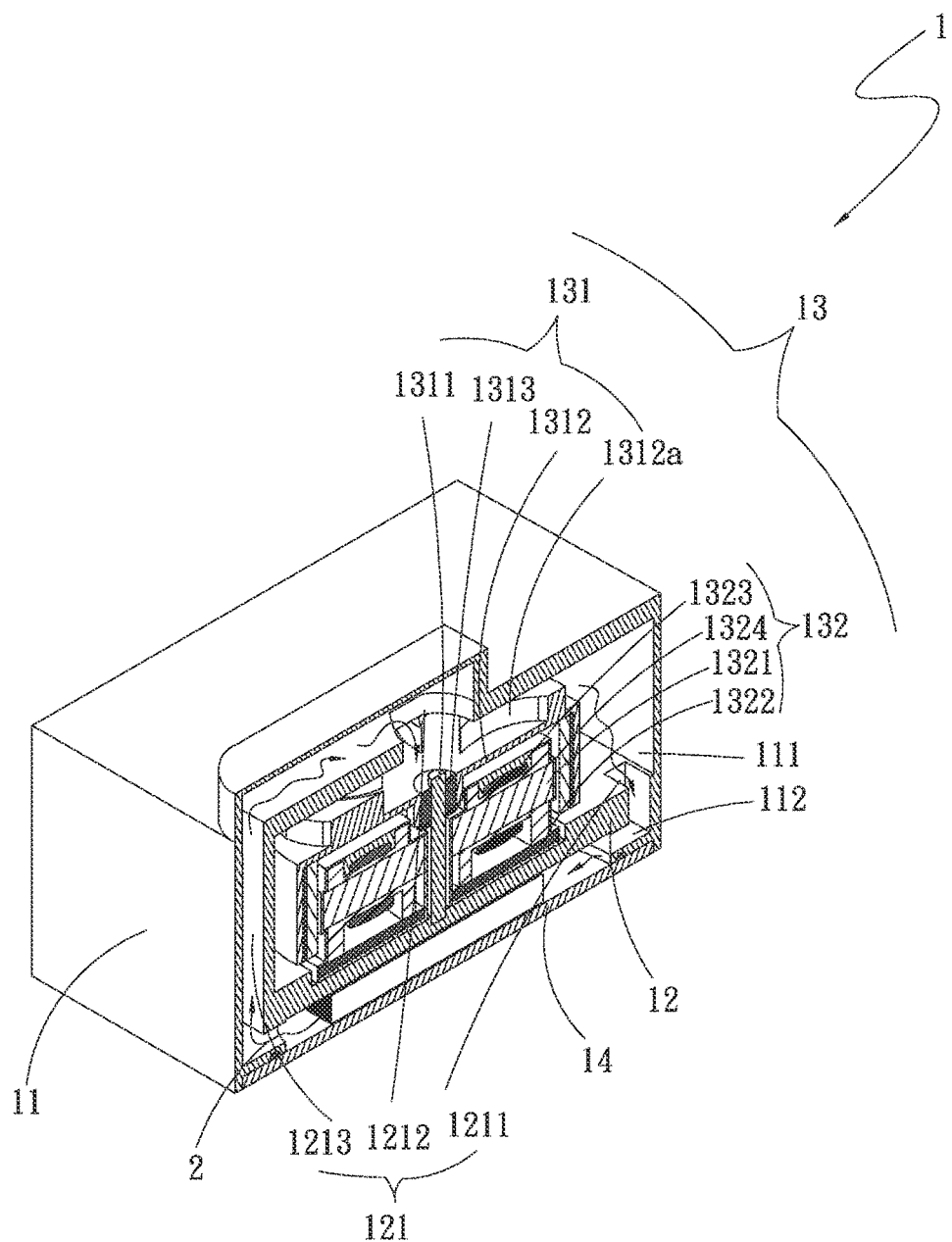
FIG. 2 is a perspective sectional view of the first embodiment of the water-cooling device of the present invention.

Please refer to FIGS. 1 and 2. FIG. 1 is a perspective exploded view of a first embodiment of the water-cooling device of the present invention. FIG. 2 is a perspective sectional view of the first embodiment of the water-cooling device of the present invention. According to the first embodiment, the water-cooling device 1 of the present invention includes a main body 11.

The main body 11 has a pump chamber 111 and a heat exchange chamber 112, which are partitioned from each other by a water room partitioning board 12. The water room partitioning board 12 has a communication section 121 for communicating the pump chamber 111 with the heat exchange chamber 112. A pump unit 13 is disposed in the pump chamber 111. A heat transfer unit 14 is disposed in the heat exchange chamber 112. A cooling fluid 2 is filled up in the pump chamber 111 and the heat exchange chamber 112.

The communication section 121 has a first communication hole 1211, a second communication hole 1212 and a passage 1213 in communication with the second communication hole 1212, whereby the pump chamber 111 communicates with the heat exchange chamber 112.

The pump unit 13 has a rotor assembly 131 and a stator assembly 132. The rotor assembly 131 and the stator assembly 132 are correspondingly disposed in the pump chamber 111. The rotor assembly 131 has a shaft 1311, a fan impeller 1312 and at least one bearing 1313 assembled with the fan impeller 1312. One end of the shaft 1311 is plug-in connected with the main body 11, while the other end of the shaft 1311 is rotatably connected with the bearing 1313. The fan impeller 1312 has multiple blades 1312a. The stator assembly 132 has multiple silicon steel sheets 1321 and a substrate 1322. The silicon steel sheets 1321 are stacked and multiple windings 1323 are wound around the silicon steel sheets 1321. The silicon steel sheets 1321 and the windings 1323 and the substrate 1322 are enclosed in a waterproof structure layer 1324.

Figure 3:
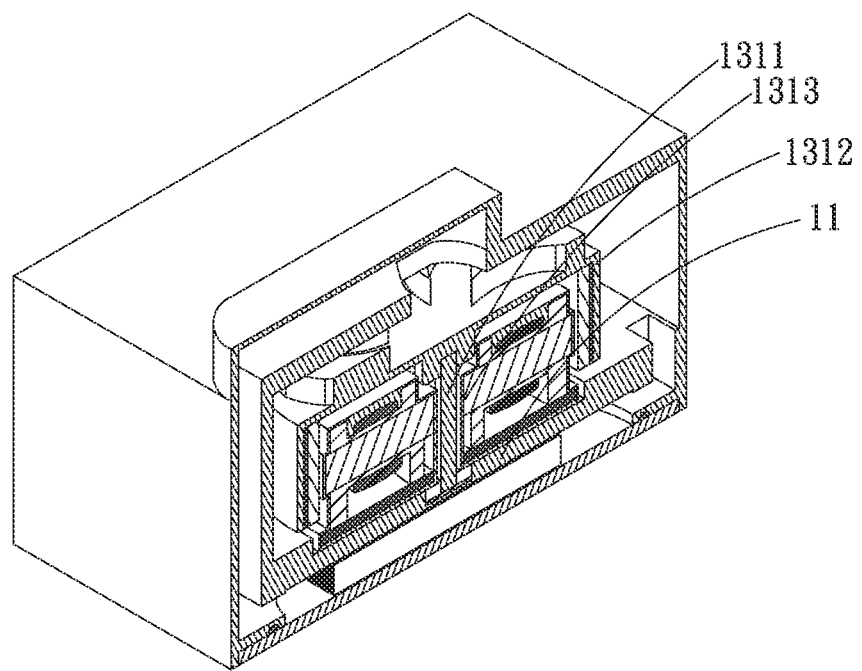
FIG. 3 is a perspective sectional view of a second embodiment of the water-cooling device of the present invention.

Please refer to FIG. 3, which is a perspective sectional view of a second embodiment of the water-cooling device of the present invention. The second embodiment is partially identical to the first embodiment in structure and thus will not be repeatedly described hereinafter. The second embodiment is different from the first embodiment in that the bearing 1313 is assembled with the main body 11. One end of the shaft 1311 is rotatably connected with the bearing 1313, while the other end of the shaft 1311 is connected with the fan impeller 1312.

Figure 4:
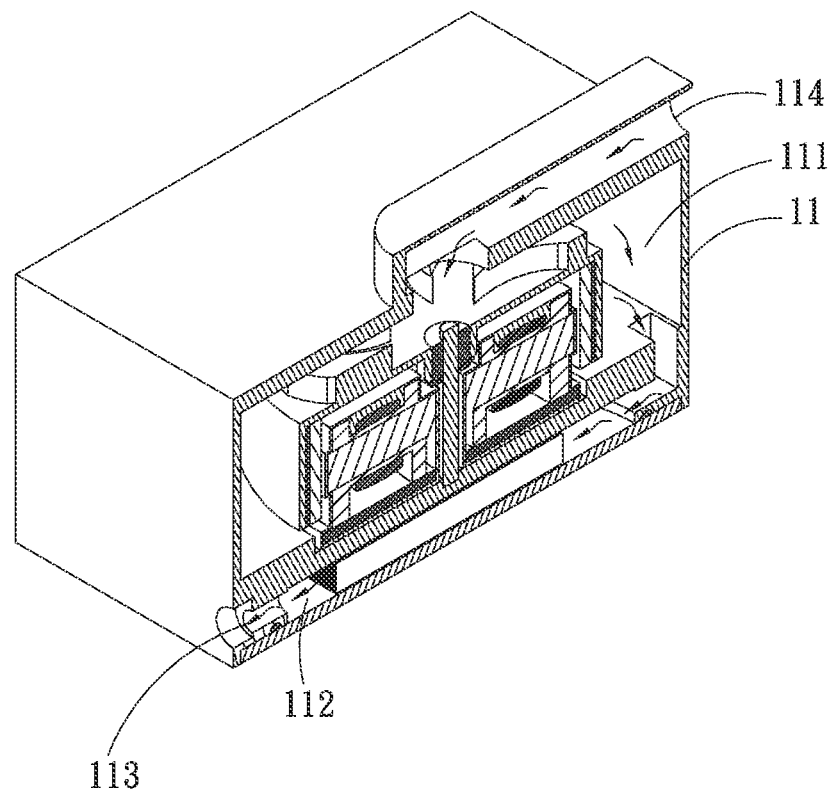
FIG. 4 is a perspective sectional view of a third embodiment of the water-cooling device of the present invention.

Please refer to FIG. 4, which is a perspective sectional view of a third embodiment of the water-cooling device of the present invention. The third embodiment is partially identical to the first embodiment in structure and thus will not be repeatedly described hereinafter. The third embodiment is different from the first embodiment in that the main body 11 further has an outlet 113 in communication with the heat exchange chamber 112 and an inlet 114 in communication with the pump chamber 111.

Figure 5:
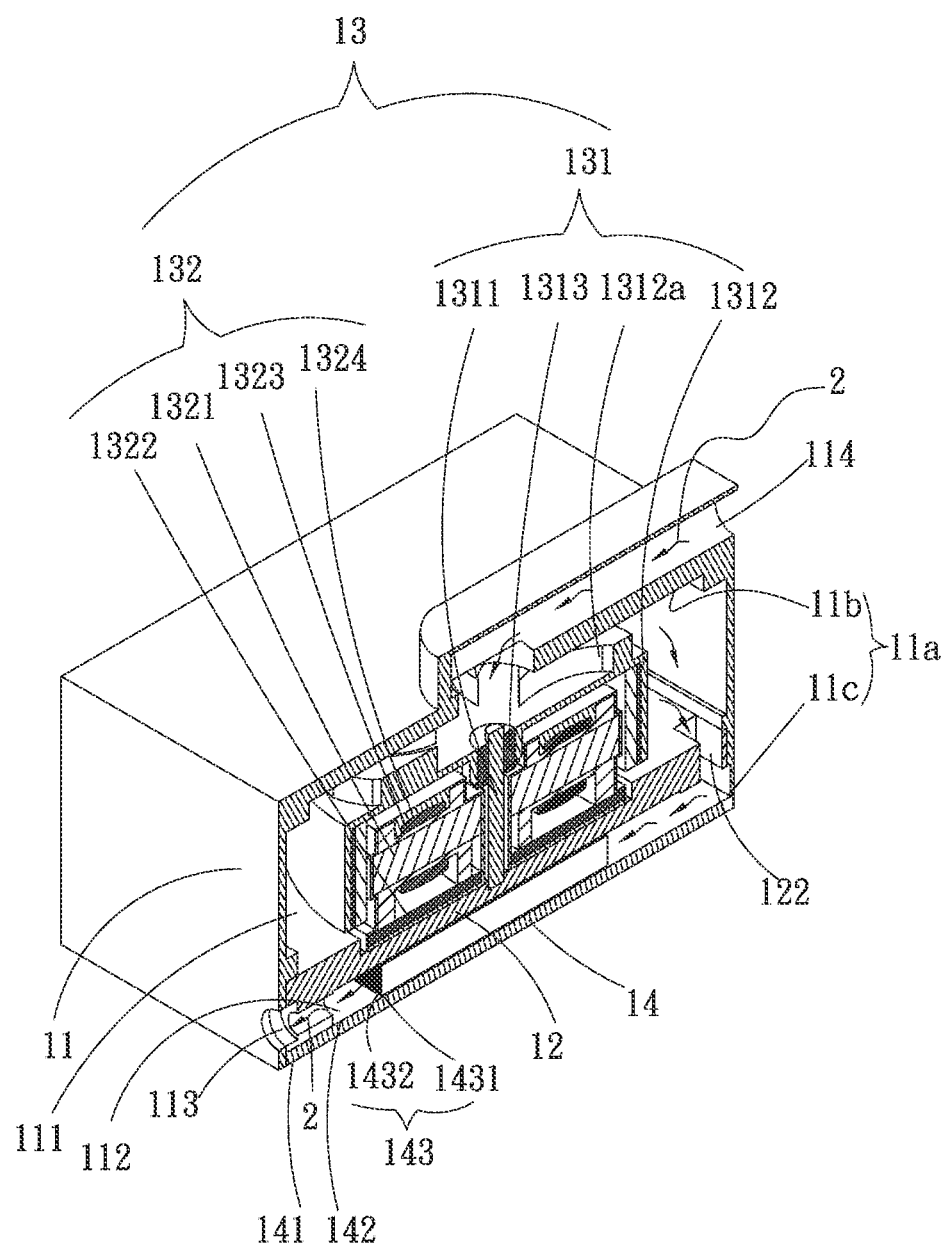
FIG. 5 is a perspective sectional view of a fourth embodiment of the water-cooling device of the present invention.

Please refer to FIG. 5, which is a perspective sectional view of a fourth embodiment of the water-cooling device of the present invention. According to the fourth embodiment, the water-cooling device 1 of the present invention includes a main body 11, an inlet 114, an outlet 113 and a heat transfer unit 14.

The main body 11 has a receiving space 11a. The receiving space 11a has a closed side 11b and an open side 11c and a water room partitioning board 12. The receiving space 11a is partitioned by the water room partitioning board 12 into a pump chamber 111 and a heat exchange chamber 112. The water room partitioning board 12 has a communication hole 122. A pump unit 13 is disposed in the pump chamber 111 and connected with the main body 11. A cooling fluid 2 is filled in the receiving space 11a. The communication hole 122 communicates the pump chamber 111 with the heat exchange chamber 112.

The inlet 114 is disposed on the closed side 11b in communication with the pump chamber 111 corresponding to the pump unit 13.

The outlet 113 is disposed on one side of the main body 11, which side is adjacent to the heat exchange chamber 112. The outlet 113 communicates with the heat exchange chamber 112.

The heat transfer unit 14 has a heat absorption face 141 and a heat dissipation face 142. The heat dissipation face 142 correspondingly blocks the open side 11c. The communication hole 122 of the water room partitioning board 12 is eccentric to the rotor assembly 131.

The pump unit 13 has a rotor assembly 131 and a stator assembly 132. The rotor assembly 131 and the stator assembly 132 are correspondingly disposed in the pump chamber 111. The rotor assembly 131 has a shaft 1311, a fan impeller 1312 and at least one bearing 1313 assembled with the fan impeller 1312. One end of the shaft 1311 is plug-in connected with the main body 11, while the other end of the shaft 1311 is rotatably connected with the bearing 1313. The fan impeller 1312 has multiple blades 1312a. The stator assembly 132 has multiple silicon steel sheets 1321 and a substrate 1322. The silicon steel sheets 1321 are stacked and multiple windings 1323 are wound around the silicon steel sheets 1321. The silicon steel sheets 1321 and the windings 1323 and the substrate 1322 are enclosed in a waterproof structure layer 1324.

Figure 6:
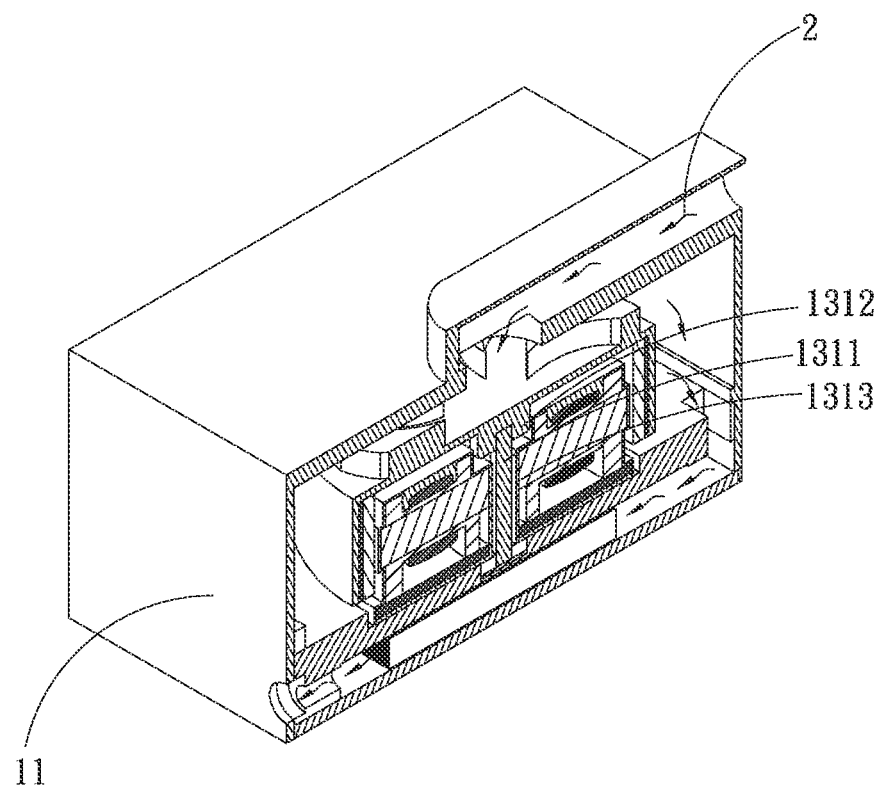
FIG. 6 is a perspective sectional view of a fifth embodiment of the water-cooling device of the present invention.

Please refer to FIG. 6, which is a perspective sectional view of a fifth embodiment of the water-cooling device of the present invention. The fifth embodiment is partially identical to the fourth embodiment in structure and thus will not be repeatedly described hereinafter. The fifth embodiment is different from the fourth embodiment in that the bearing 1313 is assembled with the main body 11. One end of the shaft 1311 is rotatably connected with the bearing 1313, while the other end of the shaft 1311 is connected with the fan impeller 1312.

Figure 7:
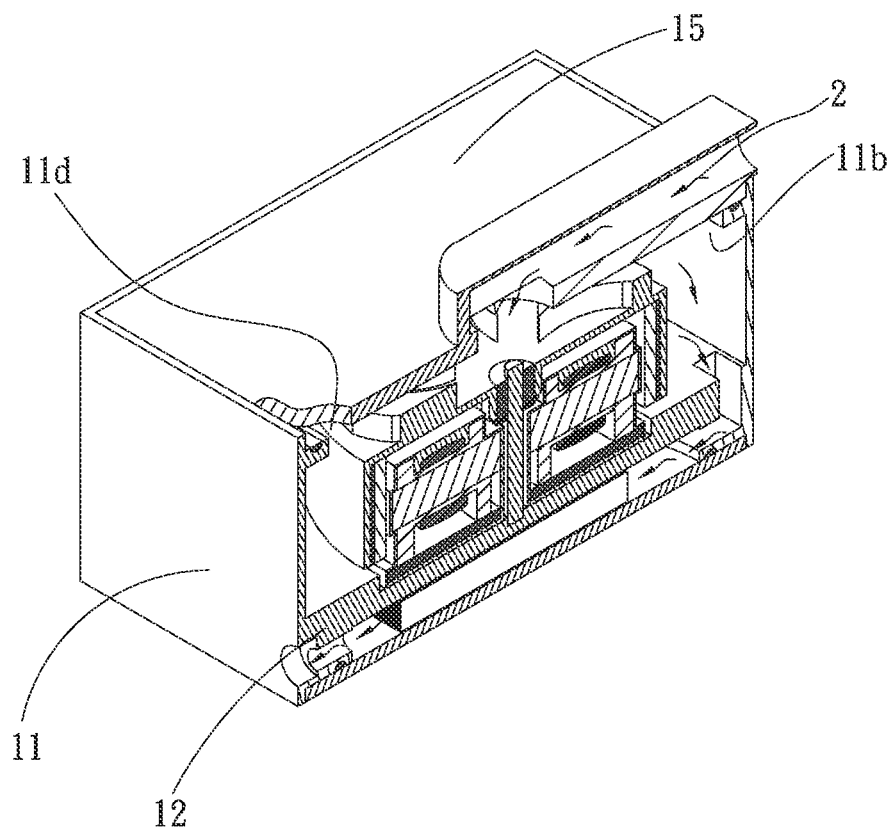
FIG. 7 is a perspective sectional view of a sixth embodiment of the water-cooling device of the present invention.

Please refer to FIG. 7, which is a perspective sectional view of a sixth embodiment of the water-cooling device of the present invention. The sixth embodiment is partially identical to the fourth embodiment in structure and thus will not be repeatedly described hereinafter. The sixth embodiment is different from the fourth embodiment in that the water-cooling device 1 further includes a cover body 15 and an opening 11d. The cover body 15 blocks the opening 11d to define the closed side 11b. The water room partitioning board 12 is integrally formed with the main body 11.

In the third to sixth embodiments, the cooling fluid 2 flows from the inlet 114 into the pump chamber 111. The blades 1312a of the rotor assembly 131 of the pump unit 13 drive the cooling fluid 2 to the communication hole 122 to flow into the heat exchange chamber 114. Then heat exchange takes place between the cooling fluid 2 and the heat dissipation section 143 disposed in the heat exchange chamber 112. Finally, the cooling fluid 2 is exhausted from the main body 11 through the outlet 113, which is disposed on one side of the main body 11 in communication with the heat exchange chamber 112.

Figure 8:
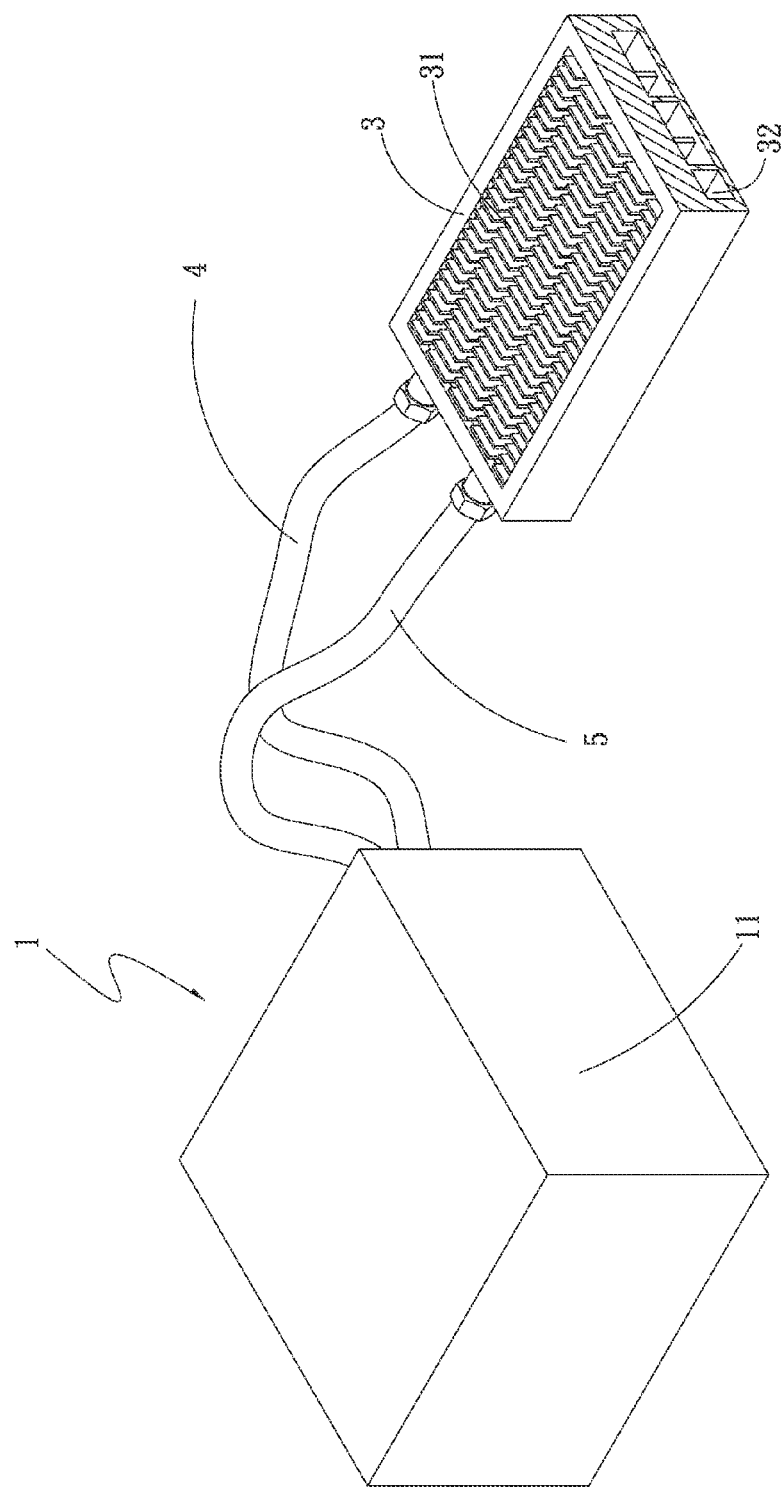
FIG. 8 is a perspective assembled view of a seventh embodiment of the water-cooling device of the present invention.

Please refer to FIG. 8, which is a perspective assembled view of a seventh embodiment of the water-cooling device of the present invention. The seventh embodiment is partially identical to the fourth embodiment in structure and thus will not be repeatedly described hereinafter. The seventh embodiment is different from the fourth embodiment in that the water-cooling device 1 further includes a heat dissipation unit 3, a first tube body 4 and a second tube body 5. The heat dissipation unit 3 communicates with the outlet 113 and inlet 114 of the main body 11 via the first and second tube bodies 4, 5. The heat dissipation unit 3 has multiple radiating fins 31. Also, the heat dissipation unit 3 has multiple internal liquid flow ways 32 in which a cooling fluid 2 is filled (with reference to FIG. 2). The heat dissipation unit 3 communicates with the outlet 113 and inlet 114 of the main body 11 via the first and second tube bodies 4, 5. After exhausted from the main body 11, the cooling fluid 2 further flows to the heat dissipation unit 3 to dissipate the heat so as to enhance heat dissipation performance.

In the first to seventh embodiments, the heat transfer unit 14 is made of a material selected from a group consisting of copper, aluminum and good thermal conductor. The heat transfer unit 14 further has a heat dissipation section 143 protruding from the heat dissipation face 142. The heat dissipation section 143 has multiple radiating fins 1431 defining therebetween at least one flow way 1432.

Figure 9:
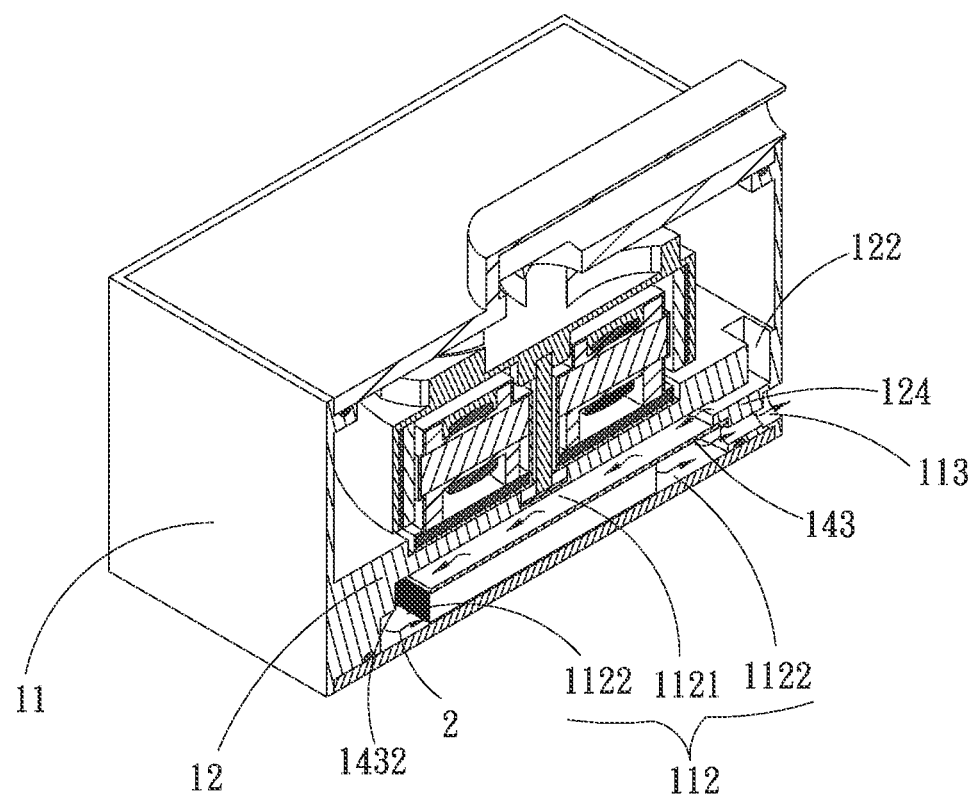
FIG. 9 is a perspective sectional view of an eighth embodiment of the water-cooling device of the present invention.

Please refer to FIG. 9, which is a perspective sectional view of an eighth embodiment of the water-cooling device of the present invention. The eighth embodiment is partially identical to the fourth embodiment in structure and thus will not be repeatedly described hereinafter. The eighth embodiment is different from the fourth embodiment in that the water room partitioning board 12 further has an extension section 124 at the communication hole 122. The extension section 124 is connected with the heat dissipation section 143 to together partition the heat exchange chamber 112 into a first heat dissipation room 1121 and a second heat dissipation room 1122. The first heat dissipation room 1121 is positioned above the heat dissipation section 143, while the second heat dissipation room 1122 is positioned on two sides of the heat dissipation section 143.

In this embodiment, when the cooling fluid 2 flows through the communication hole 122 into the heat exchange chamber 112, the cooling fluid 2 first flows into the first heat dissipation room 1121 for first-time heat dissipation. Then the cooling fluid 2 flows into the second heat dissipation room 1122 and the flow way 1432 for second-time heat dissipation. Finally, the cooling fluid 2 is exhausted from the main body 11 from the outlet 113. Such heat dissipation structure provides double heat dissipation effects so that the heat dissipation performance is greatly enhanced.

In the water-cooling device 1 of the present invention, the rotor assembly 131 and stator assembly 132 of the pump unit 13 for driving the internal cooling fluid 2 are together arranged in the pump chamber 111. That is, the pump unit 13 is entirely immersed in the cooling fluid 2. In addition, the stator assembly 132 of the pump unit 13 is enclosed in a waterproof structure layer 1324 for protecting the silicon steel sheets 1321, the substrate 1322 and the windings 1323 of the stator assembly 132. The waterproof structure layer 1324 is quite thin so that the distance between the stator assembly 132 and the rotor assembly 131 is shortened. In this case, the magnetic loss caused in magnetization between the rotor assembly 131 and the stator assembly 132 is reduced so as to enhance the rotational efficiency of the pump unit 13.

Figure 10:
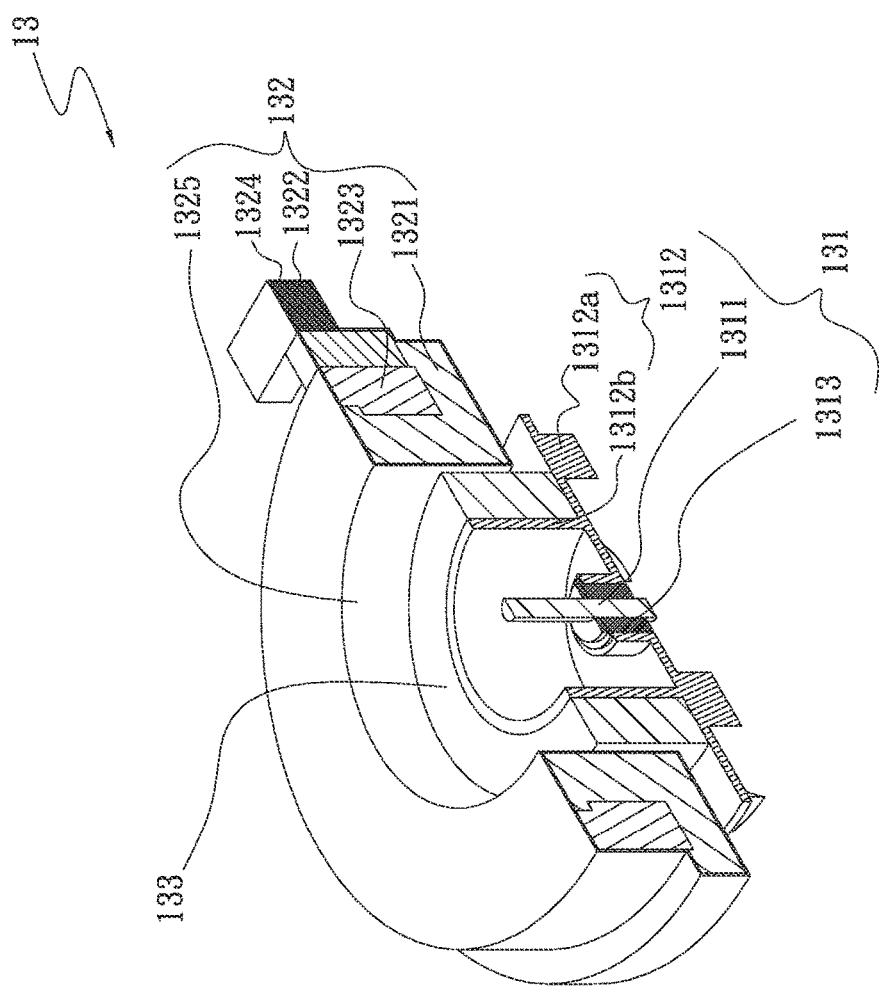
FIG. 10 is a perspective sectional view of the pump unit of still another embodiment of the water-cooling device of the present invention.

Please now refer to FIG. 10, which is a perspective sectional view of the pump unit of still another embodiment of the water-cooling device of the present invention. Also referring to FIGS. 1 to 9, in this embodiment, the pump unit 13 includes a rotor assembly 131 and a stator assembly 132 arranged around the rotor assembly 131. The pump unit 13 of this embodiment is also applicable to the above embodiments of the water-cooling device. The rotor assembly 131 and the stator assembly 132 are correspondingly disposed in the pump chamber 111. The rotor assembly 131 has a shaft 1311, a fan impeller 1312 and at least one bearing 1313 assembled with the fan impeller 1312. One end of the shaft 1311 is rotatably connected with the bearing 1313, while the other end of the shaft 1311 is connected with the main body 11 (with reference to FIGS. 1 to 9). The fan impeller 1312 has multiple blades 1312a. The stator assembly 132 has multiple silicon steel sheets 1321 and a substrate 1322. The silicon steel sheets 1321 are stacked and multiple windings 1323 are wound around the silicon steel sheets 1321. The silicon steel sheets 1321 and the windings 1323 and the substrate 1322 are enclosed in a waterproof structure layer 1324. The stator assembly 132 has a central opening 1325. The fan impeller 1312 has a fan impeller main body 1312b. The fan impeller main body 1312b is correspondingly positioned in the opening 1325 without contacting therewith. A magnetic member 133 is further disposed between the outer circumference of the fan impeller main body 1312b and the wall of the opening 1325.

The water-cooling device 1 of the present invention has a simple structure and excellent heat dissipation efficiency. Moreover, the stator assembly 14 is also immersed in the cooling fluid 2 and cooled by the cooling fluid 2 so that the problem of overheating of the stator assembly in operation that exists in the conventional stator assembly is solved. In this case, the water-cooling device 1 has a longer lifetime.

The present invention has been described with the above embodiments thereof and it is understood that many changes and modifications in the above embodiments can be carried out without departing from the scope and the spirit of the invention that is intended to be limited only by the appended claims.

What is claimed is:

1. A water-cooling device comprising a main body, the main body having a pump chamber and a heat exchange chamber, which are partitioned from each other by a water room partitioning board, the water room partitioning board being integrally formed with the main body and having a communication section, the communication section having a first communication hole, a second communication hole and a passage in communication with the second communication hole, forming an open water circulation system whereby the pump chamber communicates with the heat exchange chamber, a pump unit being disposed in the pump chamber, a heat transfer unit being disposed in the heat exchange chamber, a cooling fluid being filled up in the pump chamber and the heat exchange chamber;

wherein the pump unit has a rotor assembly and a stator assembly received in the rotor assembly, the rotor assembly and the stator assembly being correspondingly disposed in the pump chamber, the stator assembly having multiple silicon steel sheets and a substrate, the silicon steel sheets being stacked and multiple windings being wound around the silicon steel sheets, the silicon steel sheets and the windings and the substrate being enclosed in a waterproof structure layer that is thinner than the partitioning board, the waterproof structure layer completely enclosing the top and sides of the silicon steel sheets, the substrate and the windings of the stator assembly, and because the waterproof structure layer is relatively thin, a distance between the stator assembly and the rotor assembly can be shortened, such that magnetic loss caused in magnetization between the rotor assembly and the stator assembly is reduced.

2. The water-cooling device as claimed in claim 1, wherein the rotor assembly has a shaft and a fan impeller, at least one bearing being assembled with the main body, one end of the shaft being rotatably connected with the bearing, while the other end of the shaft being connected with the fan impeller, the fan impeller having multiple blades.

3. The water-cooling device as claimed in claim 1, wherein the rotor assembly has a fan impeller and at least one bearing, the bearing being assembled with the fan impeller, one end of a shaft being plug-in connected with the water room partitioning board, while the other end of the shaft being rotatably connected with the bearing, the fan impeller having multiple blades.

4. A water-cooling device comprising:
a main body, the main body having a receiving space, the receiving space having a closed side and an open side and a water room partitioning board, the receiving space being partitioned by the water room partitioning board into a pump chamber and a heat exchange chamber, the water room partitioning board being integrally formed with the main body and having a communication hole in communication with the pump chamber and the heat exchange chamber, a pump unit being disposed in the pump chamber of the main body, an inlet being disposed on the closed side in communication with the pump chamber corresponding to the pump unit, an outlet being disposed on an opposite side of the main body, in which the opposite side is adjacent to the heat exchange chamber, the outlet communicating with the heat exchange chamber;
a heat transfer unit having a heat absorption face and a heat dissipation face, the heat dissipation face correspondingly blocking the open side from the closed side; and
a cooling fluid filled in the receiving space of the main body;
wherein the pump unit has a rotor assembly and a stator assembly, the rotor assembly having a shaft, a fan impeller and at least one bearing, the stator assembly having multiple silicon steel sheets and a substrate, the silicon steel sheets being stacked and multiple windings being wound around the silicon steel sheets, the silicon steel sheets and the windings and the substrate being enclosed in a waterproof structure layer that is thinner than the partitioning board, the waterproof structure layer completely enclosing the top and sides of the silicon steel sheets, the substrate and the windings of the stator assembly, and because the waterproof structure layer is relatively thin, a distance between the stator assembly and the rotor assembly can be shortened, such that magnetic loss caused in magnetization between the rotor assembly and the stator assembly is reduced; and
wherein the communication hole of the water room partitioning board is eccentric to the rotor assembly.

5. The water-cooling device as claimed in claim 4, wherein the bearing is assembled with the main body, one end of the shaft being rotatably connected with the bearing, while the other end of the shaft being connected with the fan impeller, the fan impeller having multiple blades.

6. The water-cooling device as claimed in claim 4, wherein the bearing is assembled with the fan impeller, one end of a shaft being plug-in connected with the water room partitioning board, while the other end of the shaft is rotatably connected with the bearing, the fan impeller having multiple blades.

* * * * *